United States Patent
Jung et al.

(10) Patent No.: US 9,202,555 B2
(45) Date of Patent: Dec. 1, 2015

(54) WRITE WORD-LINE ASSIST CIRCUITRY FOR A BYTE-WRITEABLE MEMORY

(71) Applicant: QUALCOMM Incorporated, San Diego, CA (US)

(72) Inventors: Changho Jung, San Diego, CA (US); Nishith Desai, San Diego, CA (US); Sei Seung Yoon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 332 days.

(21) Appl. No.: 13/656,593

(22) Filed: Oct. 19, 2012

(65) Prior Publication Data

US 2014/0112061 A1    Apr. 24, 2014

(51) Int. Cl.
*G11C 11/00*  (2006.01)
*G11C 11/418*  (2006.01)
*G11C 8/08*  (2006.01)
*G11C 11/419*  (2006.01)

(52) U.S. Cl.
CPC .............. *G11C 11/418* (2013.01); *G11C 8/08* (2013.01); *G11C 11/419* (2013.01)

(58) Field of Classification Search
CPC ....... G11C 11/418; G11C 8/08; G11C 11/419

USPC ................ 365/154, 158.13, 185.23
See application file for complete search history.

(56) References Cited

U.S. PATENT DOCUMENTS

| | | | |
|---|---|---|---|
| 5,282,175 A * | 1/1994 | Fujita et al. ............. | 365/230.06 |
| 7,009,197 B2 * | 3/2006 | Kwak et al. ............ | G01B 11/14 |
| | | | 250/559.29 |
| 7,450,434 B2 * | 11/2008 | Tanuma et al. ........ | G11C 16/08 |
| | | | 365/185.11 |
| 7,596,012 B1 | 9/2009 | Su et al. | |
| 7,898,875 B2 | 3/2011 | Tao et al. | |
| 8,045,402 B2 | 10/2011 | Yeung | |
| 8,120,975 B2 | 2/2012 | Kenkare et al. | |
| 2012/0063211 A1 | 3/2012 | Sharma et al. | |

* cited by examiner

*Primary Examiner* — Thao H Bui
(74) *Attorney, Agent, or Firm* — Chui-kiu Teresa Wong; Paul Holdaway

(57) ABSTRACT

A write-assisted memory. The write-assisted memory includes a word-line decoder that is implemented within a low VDD power domain. The write-assisted memory also includes a write-segment controller that is partially implemented within the low VDD power domain and is partially implemented within a high VDD power domain. The write-assisted memory further includes a local write word-line decoder that is implemented within the high VDD power domain.

20 Claims, 7 Drawing Sheets

WRITE WORD-LINE ASSIST CIRCUITRY FOR A BYTE-WRITEABLE MEMORY

TECHNICAL FIELD

This disclosure relates to electronic memory operation and more specifically to write word-line assist circuitry for a byte-writeable memory.

BACKGROUND

Semiconductor memory devices include, for example, a static random access memory (SRAM) and a dynamic random access memory (DRAM). A DRAM memory cell generally includes one transistor and one capacitor, thereby providing a high degree of integration. DRAM, however, requires constant refreshing, which limits the use of DRAM to computer main memory. An SRAM memory cell, by contrast, is bi-stable, meaning that it can maintain its state indefinitely, so long as adequate power is supplied. SRAM also supports high speed operation, with lower power dissipation, which is useful for computer cache memory.

One example of an SRAM memory cell is a six transistor (6T) SRAM memory cell that includes six metal-oxide-semiconductor (MOS) transistors. As processes for fabricating MOS devices migrate to nanometer technologies, the use of conventional 6T SRAM cells within processor cache memories prohibits compliance with performance specifications. To meet these performance specifications, eight transistor (8T) SRAM cells are replacing 6T SRAM cells. Use of an 8T SRAM cell may enable independent sizing of the devices on the read and write ports of the memory cell for supporting a lower minimum write voltage ($V_{min}$), while enabling a high performance read operation. Unfortunately, the use of 8T SRAM memory cells does not overcome the effect of weak bits, which are generally caused by the nanometer technology process variations on the read port devices for large size SRAM cache memory arrays.

SUMMARY

According to one aspect of the present disclosure, a write-assist method is described. The write-assist method includes operating a write word-line decoder within a low VDD power domain. The write-assist method also includes operating a portion of a write-segment controller and a local write word-line decoder within a high VDD power domain.

According to another aspect of the present disclosure, a write-assisted memory is described. The write-assisted memory includes a word-line decoder that is implemented within a low VDD power domain. The write-assisted memory also includes a write-segment controller that is partially implemented within the low VDD power domain and is partially implemented within a high VDD power domain. The write-assisted memory further includes a local write word-line decoder that is implemented within the high VDD power domain.

According to another aspect of the present disclosure, a byte-writeable memory is described. The byte-writeable memory includes a write decoder that is implemented within a low VDD power domain of the byte-writeable memory. The write decoder is configured to supply a global write word-line (GWWL) signal in response to a bank select signal and a word line select signal. The byte-writeable memory also includes a local write word-line decoder that is implemented within a high VDD power domain. The local write word-line decoder is configured to supply a local write word-line (LWWL) signal that is generated in response to the GWWL signal and a write byte select signal, within the high VDD power domain, to enable a write assist in the byte-writeable memory.

According to a further aspect of the present disclosure, a byte-writeable memory is described. The byte-writeable memory includes means for supplying a global write word-line (GWWL) signal in response to a bank select signal and a word line select signal within a low VDD power domain of a byte-writeable memory. The byte-writeable memory also includes means for generating a local write word-line (LWWL) signal in response to the GWWL signal and a write byte select signal within a high VDD power domain of the byte-writeable memory to enable a write assist in the byte-writeable memory.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily used as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following descriptions taken in conjunction with the accompanying drawings.

DETAILED DESCRIPTION

Figure 1:
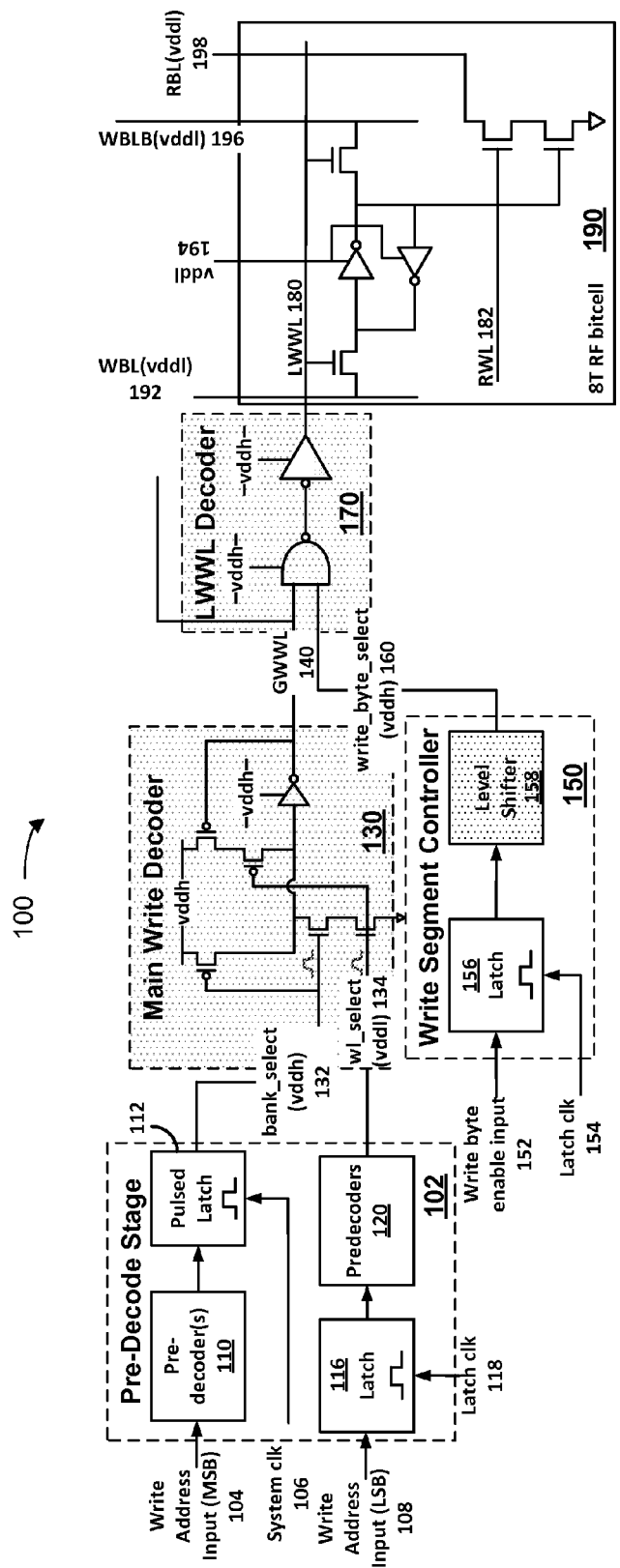
FIG. 1 is a circuit diagram illustrating a conventional write word-line assisted memory circuitry.

One aspect of the present disclosure provides write word-line assist circuitry for a byte-writeable memory. In one configuration, the write word-line assist circuitry is modified, as compared to conventional write word-line assist circuitry, by implementing a main write word-line decoder within a low VDD power domain of the byte-writeable memory. In this configuration, a portion of a write-segment controller and a local write word-line decoder of the write word-line assist circuitry are implemented within a high VDD power domain of the byte-writeable memory. In operation, the main write word-line decoder generates a global write word-line (GWWL) signal within the low VDD power domain of the byte-writeable memory.

During a write word-line assist operation, the local write word-line decoder generates a local write word-line (LWWL) signal in the high VDD power domain of the byte-writeable memory. In this configuration, the LWWL signal is generated in response to a write-byte select signal from the write-segment controller and the GWWL signal from the main write word-line decoder. The LWWL signal and complementary write bit-line signals (write bit line (WBL) and write bit line bar (WBLB)) provide a write-byte capability to a memory cell. In one configuration, the byte-writeable memory includes eight-transistor (8T) static random access memory (SRAM) register file (RF) cells.

Eight-transistor (8T) static random access memory (SRAM) cells are commonly used in single rail CPU (central processing unit) designs. 8T SRAM cells are used in single rail CPU designs because they support dynamic voltage scaling (DVS) and fast read access. 8T SRAM cells also allow the read performance in a register file type design of L0/L1 (level 0 (L0)/level 1 (L1)) cache memories to track with a logic device performance. Even though an 8T read port can be independently sized for a high read current, the associated cost in terms of area and leakage becomes a significant part of the CPU budget for large size L0/L1 cache memory arrays.

In nanometer semiconductor technologies, the read/write margin for memory cells is diminishing due to increased process variations. The increased process variations also limit a minimum write voltage ($V_{min}$) of the 8T cells that sets the overall minimum operation voltage ($V_{min}$) for singe rail CPUs. Various circuit assist techniques are commonly used to maintain scalability of the memory cell. The circuit assist techniques also improve the $V_{min}$ of the memory cell, for example, to enable dynamic voltage scaling (DVS) within circuits incorporating the memory cells. A low DVS may enable low power operation of a mobile CPU that uses SRAM arrays.

A mobile CPU may specify an aggressive power specification; therefore, lowering the 8T cell $V_{min}$ is a consideration. In a mobile CPU that includes an 8T memory cell, with separate read and write ports, a cell write $V_{min}$ and a read current may be improved by boosting a word-line voltage. In particular, one technique to improve the read/write margin raises the word-line voltage relative to memory cell voltage. The word line voltage can be raised by creating a high voltage island for the memory cell. The voltage island, however, has a high design cost in terms of area, performance and power due to use of a level shifter and an additional high voltage supply. The higher voltage supply can also be generated on-chip using charge pump circuits; however such charge pump circuits consume significant area and power. By raising the word-line voltage, a write margin and a read current of the weak bit cell are improved. Hence, there is an area and a power cost involved with implementing a boosting scheme. Furthermore, gate oxide reliability can be an issue if the word-line is boosted over the highest voltage allowed in the technology.

In one aspect of the present disclosure, write word-line assist circuitry for a byte-writeable memory is described. In one configuration, the write word-line assist circuitry includes a main write word-line decoder placed that is implemented within a low VDD power domain of the byte-writeable memory. In this configuration, a portion of a write-segment controller and a local write word-line decoder of the write word-line assist circuitry are implemented within a high VDD power domain of the byte-writeable memory. In operation, the main write word-line decoder generates a global write word-line (GWWL) signal within the low VDD power domain of the byte-writeable memory.

During a write word-line assist operation, the local write word-line decoder generates a local write word-line (LWWL) signal in the high VDD power domain of the byte-writeable memory. In this configuration, the LWWL signal is generated in response to a write-byte select signal from the write-segment controller and the GWWL signal from the main write word-line decoder. The LWWL signal and complementary write bit-line signal (WBL and WBLB) provide a write-byte capability to a register file (RF) bit cell. In one configuration, the byte-writeable memory includes eight-transistor (8T) static random access memory (SRAM) register file (RF) cells.

FIG. 1 is a circuit diagram illustrating conventional write word-line assisted memory circuitry 100. As shown in FIG. 1, a pre-decode stage 102 generates a bank_select signal 132 and a word-line select signal 134 (wl_select) in response to the most significant bits (MSBs) of a write address input signal 104, the least significant bits (LSBs) of a write address input signal 108, and a system clock (clk) signal 106 from the VDDL power domain. A pulsed latch 112 receives an output from pre-decoder(s) 110 in response to the MSB write address input signal 104 to generate the bank_select signal 132 in the VDDH power domain. A pre-decoder(s) 120 receives an output from a latch 116 in response to the LSB of the write address input signal 108 and a latch clock (clk) 118 signal to generate the word-line select signal 134 in the VDDL power domain. The VDDH (high) power domain can be in the range of 1 volt to 1.2 volts, and the VDDL (low) power domain can be in the range of 0.6 volts to 0.8 volts in a dual power supply system.

As further illustrated in FIG. 1, a main write decoder 130 generates a global write word-line (GWWL) signal 140 in a high VDD (VDDH) power domain in response to the bank_select signal 132 and the word-line select signal 134. The GWWL signal 140 is enabled by the rising edge of the bank_select signal 132 and the word-line select signal 134 and disabled by a falling edge of a system clock 106. A write segment controller 150 generates a write_byte_select signal 160 in the VDDH power domain. The write segment controller 150 includes a level shifter 158 that receives an output from a latch 156 that is generated in response to a latch clock (clk) signal 154 and a write byte enable input signal 152 to provide the write_byte_select signal 160 within the VDDH power domain.

Write word-line boosting is supported by a local write word-line (LWWL) decoder 170. In FIG. 1, the LWWL decoder 170 generates a LWWL signal 180 for performing a write word-line assisted memory operation within the register file (RF) bit cell 190. A write word-line assisted operation is performed in response to the LWWL signal 180 and complementary write bit-line signals (WBL and WBLB) 192 and 196 to provide a write assisted, write-byte capability for the RF bit cell 190. A read bit line (RBL) signal 198 and a read word-line (RWL) signal 182 are also shown.

In FIG. 1, the main write decoder 130, the write segment controller 150 and the local write word-line (LWWL) decoder 170 are implemented within the VDDH power domain of the write word-line assisted memory circuitry 100. The pre-decode stage 102 and the register file (RF) bit cell 190 are implemented within the VDDL power domain of the write word-line assisted memory circuitry 100. In operation, the main write decoder 130 in the VDDH power domain is followed by the LWWL decoder 170 to generate the LWWL signal 180. The LWWL signal 180 is generated in response to the GWWL signal 140 and a level shifted, write_byte_select signal 160 from the write segment controller 150 to enable a write word-line assist memory operation within the RF bit cell 190.

Figure 2:
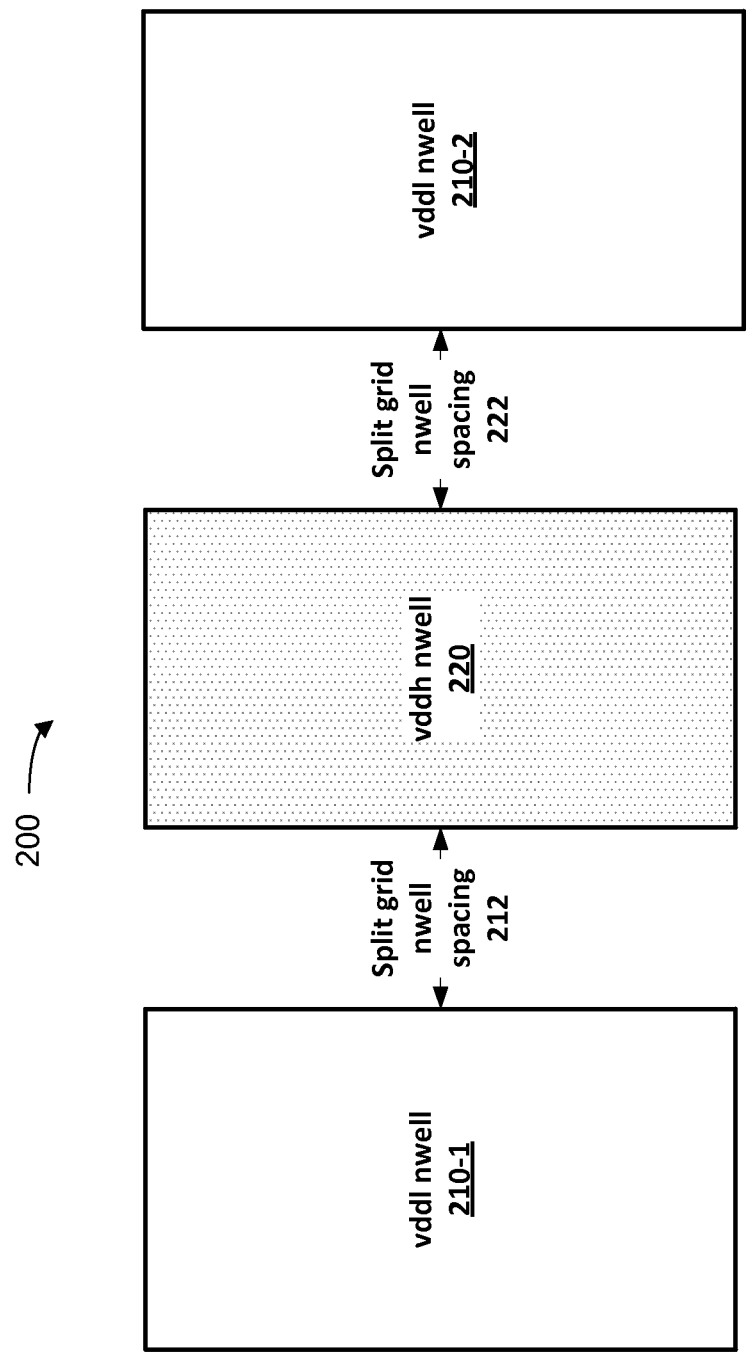
FIG. 2 is a block diagram illustrating a spacing layout penalty for implementing the circuit diagram for the conventional write word-line assisted memory circuitry of FIG. 1.

FIG. 2 is a block diagram illustrating a spacing layout penalty 200 for implementing the conventional write word-line assisted memory circuitry 100 of FIG. 1. Representatively, N-type wells (nwells) in the VDDL domain (VDDL nwells) 210 (210-1 and 210-2) are separated from a VDDH nwell 220 by split grid nwell spacing 212 and 222. Extra nwell spacing between the VDDL nwells 210 and the VDDH nwell 220 causes the spacing layout penalty 200 when implementing the write word-line assisted memory circuitry 100 of FIG. 1 because the main write decoder 130, the write segment controller 150, and the LWWL decoder 170 are implemented in the VDDH power domain. Furthermore, an increased number of power rails within the main write decoder 130 consume an increased amount of VDDH dynamic power. In addition, the design layout from implementing the write word-line assisted memory circuitry 100 of FIG. 1 is complicated.

Figure 3:
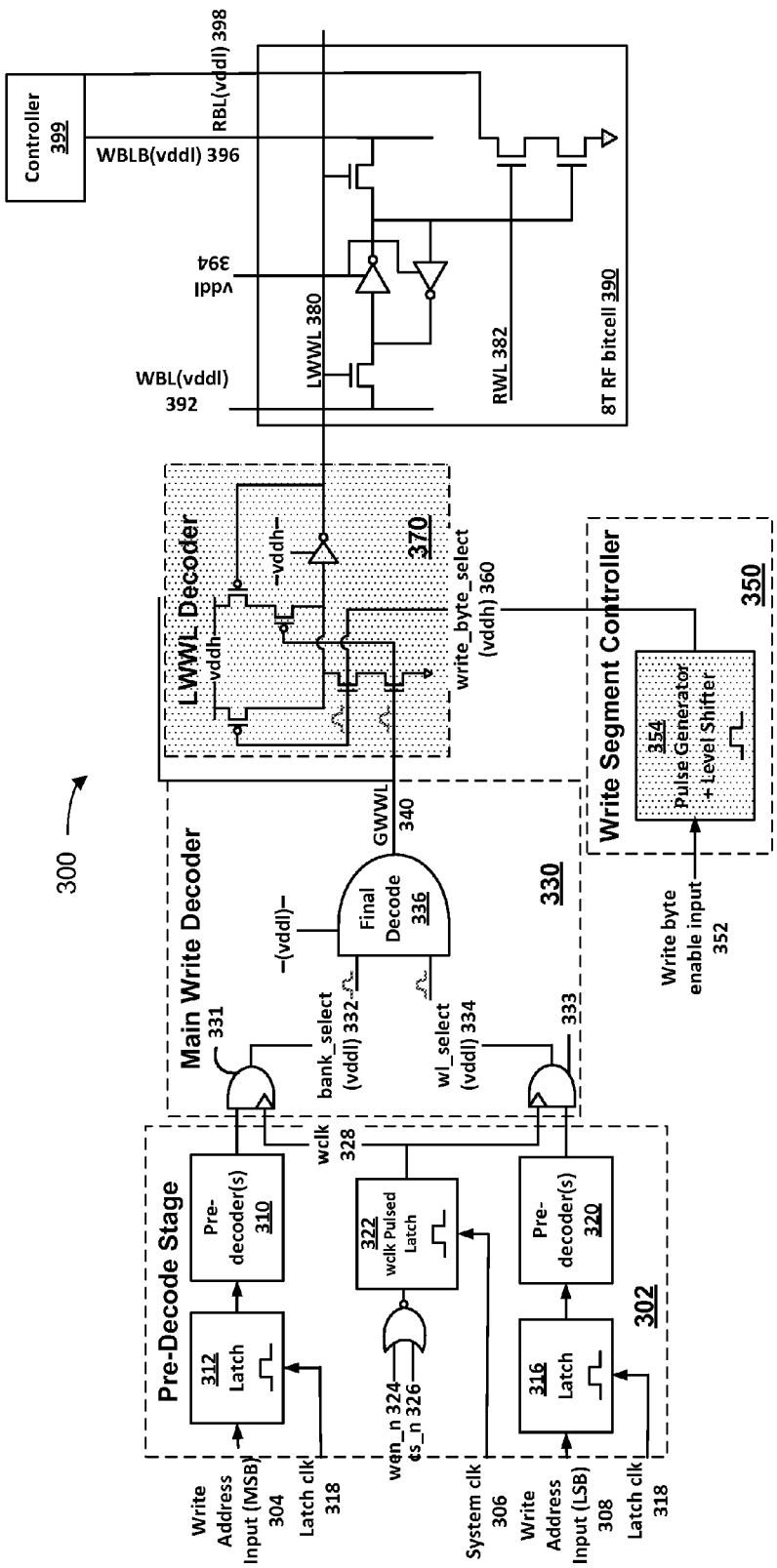
FIG. 3 is a diagram illustrating a byte-writeable memory including write word-line assist circuitry according to an aspect of the present disclosure.

FIG. 3 is diagram illustrating a byte-writeable memory including write word-line assist memory circuitry 300 according to an aspect of the present disclosure. In this aspect of the present disclosure, the write word-line assist memory circuitry 300 includes a main write decoder 330 that is implemented within a low VDD (VDDL) power domain of the byte-writeable memory. A write-segment controller 350 of the write word-line assist memory circuitry 300 is implemented partially within the VDDL power domain and partially within the VDDH power domain of the byte-writeable memory. To enable a write word-line boost operation, a local write word-line (LWWL) decoder 370 is implemented within a high VDD (VDDH) power domain of the byte-writeable memory. In operation, the LWWL decoder 370 generates a local write word-line (LWWL) signal 380 within the VDDH power domain of the byte-writeable memory in response to the GWWL signal 340 from the main write decoder 330 and a write_byte_select signal 360 from the write-segment controller 350. In this configuration, the GWWL signal 340 is implemented in the VDDL power domain, and the write_byte_select signal 360 is implemented in the VDDH power domain.

As shown in FIG. 3, a pre-decode stage 302 generates a bank select signal 332 (bank select) and a word-line select signal 334 (wl_select) in response to the most significant bits (MSB) of a write address input signal 304, the least significant bit (LSB) of a write address input signal 308, and a system clock (clk) signal 306. A pre-decoder(s) 310 receives an output from latch 312 in response to the write address input signal 304 and a latch clock (clk) 318 to generate the bank select signal 332 through clocked logic (NAND) gate 331 in the VDDL power domain. A pre-decoder(s) 320 receives an output from a latch 316 in response to the LSB of the write address input signal 308 and the latch clock (clk) 318 signal to generate a word-line select signal 334 (wl_select) through clocked logic (NAND) gate 333 in the VDDL power domain. In this configuration, a write clock (wclk) pulsed latch 322 generates a write clock signal 328 (wclk) from a logic gate output of a write enable (wen_n) signal 324 and a chip select (cs_n) signal 326.

As further illustrated in FIG. 3, a main write decoder 330 generates a global write word-line (GWWL) signal 340 in the VDDL power domain in response to the bank select signal 332 and the word-line select signal 334. In this configuration, the write clock signal 328 controls the gating of the bank select signal 332 and the word-line select signal 334 through the clocked logic gates 331 and 333, which are inputs to the final decode logic 336 of the main write decoder 330. The GWWL signal 340 is enabled by a rising edge of the bank select signal 332 and the word-line select signal 334, and disabled by a falling edge of the write clock signal 328. A write-segment controller 350 generates a write_byte_select signal 360 in the VDDH power domain. The write-segment controller 350 includes a pulse generator and level shifter 354 that receives a write byte enable input signal 352 to provide the write_byte_select signal 360 within the VDDH power domain.

Write word-line boosting is supported by a local write word-line (LWWL) decoder 370 in the VDDH power domain. In FIG. 3, the LWWL decoder 370 generates a LWWL signal 380 in response to the GWWL signal 340 from the main write decoder 330 and a write_byte_select signal 360 from the write-segment controller 350 for performing a write word-line assisted memory operation within a register file (RF) bit cell 390. A write word-line assisted operation is performed in response to the LWWL signal 380, and complementary write bit-line signals (WBL and WBLB) 392 and 396 to provide a write assisted, write-byte capability for the RF bit cell 390 using a controller 399. A read bit line (RBL) signal 398, a read word-line (RWL) signal 382 and a VDDL power supply 394 are also shown.

In FIG. 3, the LWWL decoder 370 is implemented within the VDDH power domain of the write word-line assist memory circuitry 300. The pre-decode stage 302, the main write decoder 330, and the register file (RF) bit cell 390 are implemented within the VDDL power domain of the write word-line assist memory circuitry 300. The write-segment controller 350, however, is implemented partially within the VDDL power domain and partially within the VDDH power domain in this configuration of the write word-line assist memory circuitry 300. In operation, the main write decoder 330 in the VDDL power domain is followed by the LWWL decoder 370 to generate the LWWL signal 380 in the VDDH power domain. The LWWL signal 380 is generated in response to the GWWL signal 340 and a level shifted, write_byte_select signal 360 from the write-segment controller 350 to enable a write word-line assist memory operation within the RF bit cell 390.

Figure 4:
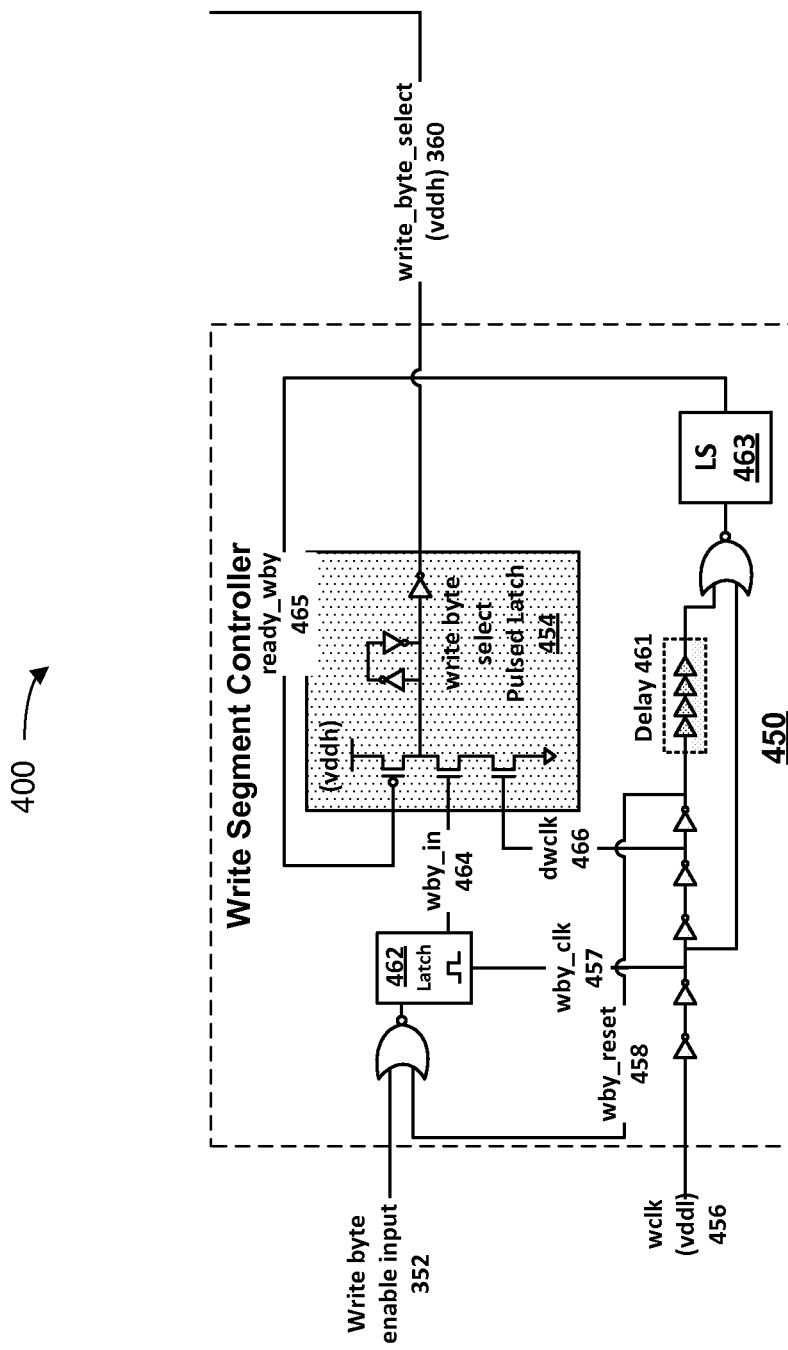
FIG. 4 is a circuit diagram illustrating a write-segment controller of the write word-line assist memory circuitry of FIG. 3 according to an aspect of the present disclosure.

FIG. 4 is a circuit diagram illustrating a write-segment controller circuitry 400 of the write word-line assist memory circuitry 300 of FIG. 3 according to an aspect of the present disclosure. Representatively, a write byte select pulsed latch 454 operates within the VDDH power domain to generate the write_byte_select signal 460. The write segment controller 450 receives the write byte enable input signal 352 and a write clock signal 456 (wclk), both in the VDDL power domain. A latch 462 receives an output of a logic gate combination of the write byte enable input signal 452 and a write byte reset signal 458 (wby_reset) to output a write byte input signal 464 (wby_in) when clocked by a write byte clock signal 457 (wby_clk). The write byte clock signal 457 and a data write clock signal 466 (dwclk) may be delayed versions of the write clock signal 456 from the VDDL power domain. A level shifter (LS) 465 receives an output of a one-shot pulse generator circuit that receives a delay 461 of the wby_reset signal 458 and the write byte clock signal 457 to generate a ready write byte signal 465 (ready_wby) that the LS 463 shifts from the VDDL power domain to the VDDH power domain. In this configuration, the write byte select pulsed latch 454 operates within the VDDH domain to generate the write_byte_select signal 360 in response to the write byte input signal 464, the ready write byte signal 465, and the data write clock signal 466.

In the configurations shown in FIGS. 3 and 4, the VDDH power domain of the write word-line assist memory circuitry 300 is restricted to the LWWL decoder 370 and the write byte select pulsed latch 454 of the write-segment controller circuitry 400. That is, the main write decoder 330 is implemented in the VDDL power domain and the clocked write_byte_select signal 360 is provided in the VDDH power domain for local write word-line decoding. This configuration uses less power and less area as compared to the conventional write word-line assisted memory circuitry 100 of FIG. 1. In addition, the write segment controller 450 provides enable and disable circuits locally for the write byte select pulsed latch 454 that may show improved tolerance to variation.

Figure 5:
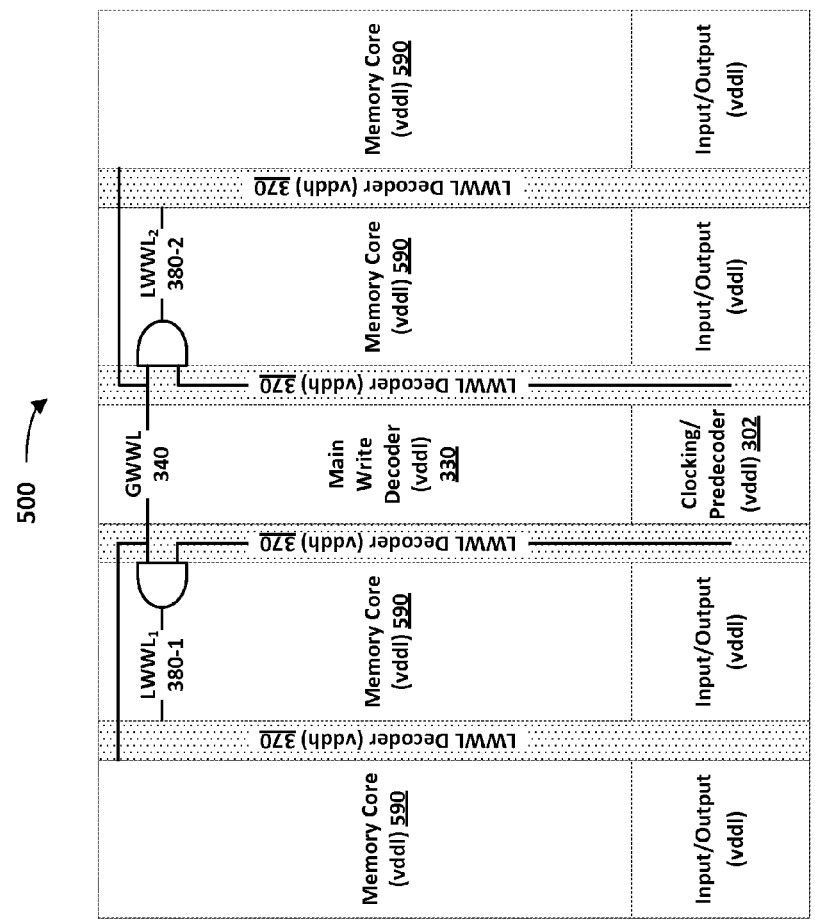
FIG. 5 is a block diagram illustrating a reduced spacing layout for implementing the write-assist circuitry according to an aspect of the present disclosure.

FIG. 5 is a block diagram illustrating a spacing layout 500 for implementing the write word-line assist memory circuitry 300 of FIG. 3. Representatively, the VDDH power domain rails are limited to the LWWL decoder 370. The memory core 590, the main write decoder 330, the input/output, and the clocking/pre-decoders 502 are provided within the VDDL power domain. In this configuration, the main write word-line (final) decoder 330 provides the GWWL signal 340 to the LWWL decoders within the VDDH power domain to generate the LWWL signals 380 (380-1 and 380-2). As shown in FIG. 5, the implementation of the write word-line assist memory circuitry 300 of FIGS. 3 and 4 saves area and significant dynamic power. Area savings results from implementing the main write decoder 330 within a single VDDL power domain rather than being separated into a VDDL power domain and a VDDH power domain, as in FIG. 2. Power savings results from reducing the number of VDDH power domain rails by implementing the main write decoder 330 within the VDDL power domain rather than the VDDH power domain, as in FIG. 2. In addition the reduced pulsed latch usage within, for example, the write-segment controller circuitry 400 of FIG. 4 provides additional layout area savings.

Figure 6:
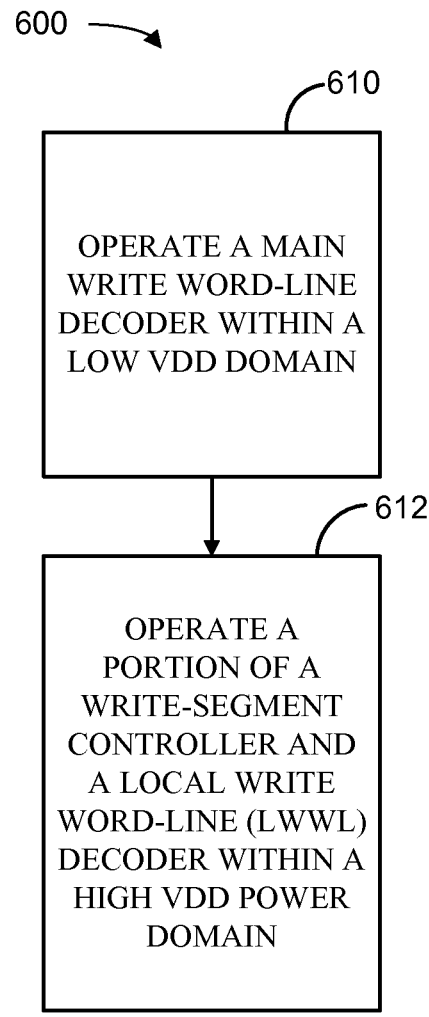
FIG. 6 is a flow chart illustrating a method of write assist operation within a byte-writeable memory according to an aspect of the present disclosure.

FIG. 6 is a flow chart illustrating a method 600 for a write assist operation within a byte-writeable memory according to an aspect of the present disclosure. At block 610, a (main) write word-line decoder is operated within a low VDD power domain. For example, as shown in FIG. 3, the main write decoder 330 is operated within the low VDD power domain to generate the global write word-line (GWWL) signal 340 within the low VDD power domain. At block 612, a portion of a write-segment controller and a local write word-line (LWWL) decoder are operated within a high VDD power domain. For example, as shown in FIG. 3, the LWWL decoder 370 is operated within the high VDD power domain to generate the LWWL signal 380 within the high VDD power domain. As shown in FIG. 4, the write segment controller 450 is partially implemented in the low VDD power domain and the high VDD power domain. In particular, a write byte select pulsed latch 454 of the write segment controller 450 is implemented within the high VDD power domain. In this configuration, the write byte select pulsed latch 454 generates the write_byte_select signal 460 in the high VDD power domain. As shown in FIG. 3, the LWWL decoder 370 generates the LWWL signal 380 in response to the write_byte_select signal 360 and the GWWL signal 340.

In one configuration, a write word-line assist memory circuitry includes means for supplying a global write word-line (GWWL) signal in response to a bank select signal and a word line select signal within a low VDD power domain of a byte-writeable memory. In one aspect of the disclosure, the supplying means may be the main write decoder 330 configured to perform the functions recited by the supplying means. In this configuration, the write word-line assist memory circuitry also includes means for generating a local write word-line (LWWL) signal in response to the GWWL signal and a write byte select signal within a high VDD power domain of the byte-writeable memory to enable a write assist in the byte-writeable memory. In one aspect of the disclosure, the generating means may be the LWWL decoder 370 configured to perform the functions recited by the generating means. In another aspect, the aforementioned means may be any module or any apparatus configured to perform the functions recited by the aforementioned means.

Figure 7:
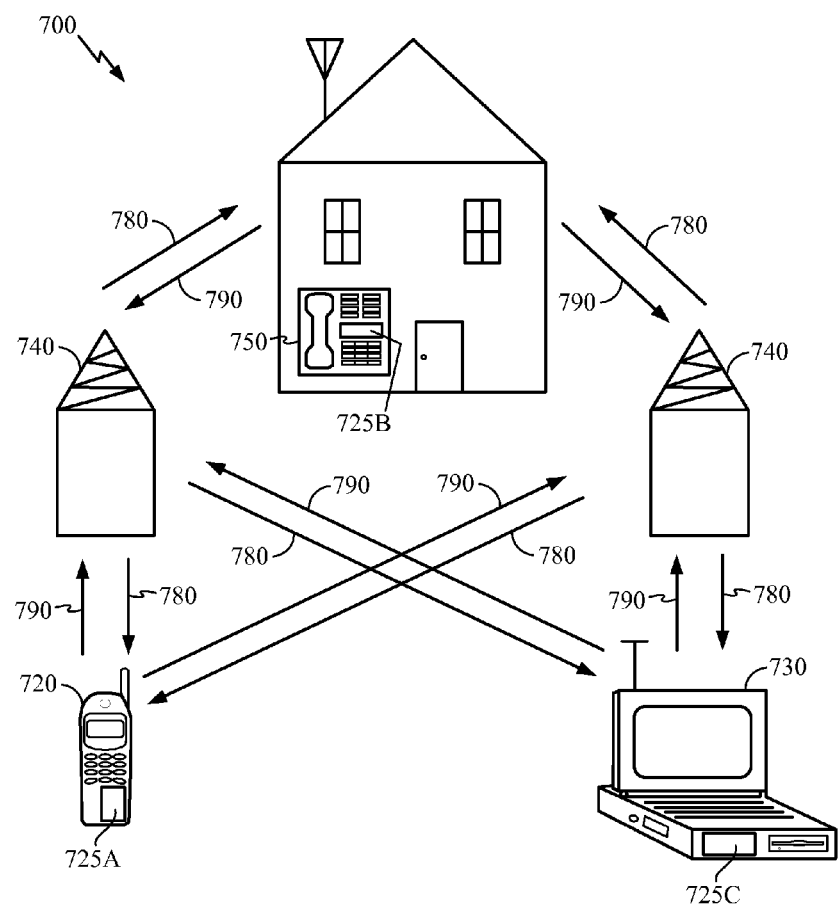
FIG. 7 is a block diagram showing an exemplary wireless communication system in which aspects of the disclosure may be advantageously employed.

FIG. 7 shows an exemplary wireless communication system 700 in which an embodiment of the disclosure may be advantageously employed. For purposes of illustration, FIG. 7 shows three remote units 720, 730, and 750 and two base stations 740. It will be recognized that typical wireless communication systems may have many more remote units and base stations. Remote units 720, 730, and 750 include write word-line assisted memory circuitry 725A, 725B, and 725C, respectively, which are aspects of the disclosure as discussed further below. FIG. 7 shows forward link signals 780 from the base stations 740 and the remote units 720, 730, and 750 and reverse link signals 790 from the remote units 720, 730, and 750 to base stations 740.

In FIG. 7, remote unit 720 is shown as a mobile telephone, remote unit 730 is shown as a portable computer, and remote unit 750 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 7 illustrates write word-line assisted memory circuitry according to the teachings of the disclosure, the disclosure is not limited to these exemplary illustrated units. For instance, write word-line assisted memory circuitry according to aspects of the present disclosure may be suitably employed in any device.

Although specific circuitry has been set forth, it will be appreciated by those skilled in the art that not all of the disclosed circuitry is required to practice the disclosure. Moreover, certain well known circuits have not been described, to maintain focus on the disclosure. Similarly, although the description refers to logical "0" and logical "1" in certain locations, one skilled in the art appreciates that the logical values can be switched, with the remainder of the circuit adjusted accordingly, without affecting operation of the present disclosure.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A method, comprising:
providing, at a first voltage, operating power to a main word-line decoder of a memory;
providing, at a second voltage, operating power to a portion of write byte signal control logic and a local word-line decoder of the memory, the second voltage higher than the first voltage;
receiving, at the local word-line decoder, a main word-line signal generated by the main word-line decoder;
receiving, at the local word-line decoder, a write byte signal generated by the portion of the write byte signal control logic; and
generating, at the local word-line decoder and in response to receiving the main word-line signal and the write byte signal, a local word-line signal effective to enable data to be written to the memory.

2. The method of claim 1, further comprising writing a bit of the data to a bit-cell of the memory based on complementary bit-line signals that indicate a value for the bit of data.

3. The method of claim 1, wherein the second voltage is higher than the first voltage by at least 0.2 volts.

4. The method of claim 1, wherein a range of the first voltage includes voltages from 0.6 volts to 0.8 volts and a range of the second voltage includes voltages from 1.0 volts to 1.2 volts.

5. The method of claim 1, further comprising providing, at the first voltage, operating power to another portion of the write byte signal control logic that is configured to receive a write byte enable signal.

6. The method of claim 1, wherein the portion of the write byte signal control logic comprises a latch configured to pulse the write byte signal received by the local word-line decoder.

7. The method of claim 1, wherein generating the local word-line signal is effective to perform a local word-line boost operation.

8. A memory comprising:
a main word-line decoder powered by a first power rail configured to provide power at a first voltage;
a first portion of write byte signal control logic powered by the first power rail;
a second portion of the write byte signal control logic powered by a second power rail configured to provide power at a second voltage that is higher than the first voltage;
a local word-line decoder powered by the second power rail and configured to:
receive a main word-line signal generated by the main word-line decoder;
receive a write byte signal generated by the second portion of the write byte signal control logic; and
generate, in response to receiving the main word-line signal and the write byte signal, a local word-line signal effective to enable data to be written to the memory.

9. The memory of claim 8, further comprising:
a controller configured to write a byte of the data within the memory in response to:
the local word-line signal generated by the local word-line decoder; and
complementary write bit-line signals indicating values for the byte of data.

10. The memory of claim 8, further comprising:
a register file (RF) memory array; and
a controller configured to write a byte of the data within the RF memory array in response to:
the local word-line signal generated by the local word-line decoder; and
complementary write bit-line signals indicating values for the byte of data.

11. The memory of claim 8, wherein the second portion of the write byte signal control logic comprises a write byte select pulsed latch and is configured to generate the write byte select signal in response to a write byte enable input signal received from the first portion of the write byte signal control logic.

12. The memory of claim 11, wherein the second portion of the write byte signal control logic further comprises a level shifter configured to shift a write byte ready signal from a first signal level that corresponds to the first voltage to a second signal level that corresponds to the second voltage.

13. The memory of claim 8, wherein storage elements of the memory are configured as eight transistor (8T) static random access memory (SRAM) register file (RF) bit cells.

14. The memory of claim 8, wherein generation of the local word-line signal is effective to perform a local word-line boost operation.

15. A memory comprising:
means for providing, at a first voltage, operating power to a main word-line decoder of the memory;
means for providing, at a second voltage, operating power to a portion of write byte signal control logic and a local word-line decoder of the memory, the second voltage higher than the first voltage;
means for receiving a main word-line signal from the main word-line decoder;
means for receiving a write byte signal from the portion of the write byte signal control logic; and
means for causing, in response receiving to the main word-line signal and the write byte signal, the local word-line decoder to generate a local word-line signal effective to enable data to be written to the memory.

16. The memory of claim 15, further comprising:
means for providing, at the first voltage, operating power to another portion of the write byte signal control logic; and
means for causing the other portion of the write byte signal control logic to generate the write byte signal in response to receiving a write byte enable input signal.

17. The memory of claim 16, further comprising means for level shifting the write byte signal from a first signal level that corresponds to the first voltage to a second signal level that corresponds to the second voltage.

18. The memory of claim 15, in which storage elements of the memory are configured as eight transistor (8T) static random access memory (SRAM) register file (RF) bit cells.

19. The memory of claim 15, wherein generation of the local word-line signal is effective to perform a local word-line boost operation.

20. The memory of claim 15, further comprising:
a register file (RF) memory array; and
means for writing a byte of the data within the RF memory array in response to:
  the local word-line signal generated by the local word-line decoder; and
  complementary write bit-line signals.

* * * * *